(12) United States Patent
Kim et al.

(10) Patent No.: US 12,389,336 B2
(45) Date of Patent: Aug. 12, 2025

(54) METHOD OF CONTROLLING POWER SUPPLY FOR AMPLIFYING RADIO FREQUENCY SIGNAL AND COMMUNICATION APPARATUS FOR PERFORMING THE SAME

(71) Applicant: SAMSUNG ELECTRONICS CO., LTD., Suwon-si (KR)

(72) Inventors: Jaeho Kim, Suwon-si (KR); Suho Jin, Suwon-si (KR); Hyeok Kwon, Suwon-si (KR); Jongyeon Kim, Suwon-si (KR); Dongju Lee, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 427 days.

(21) Appl. No.: 18/086,642

(22) Filed: Dec. 22, 2022

(65) Prior Publication Data

US 2023/0156613 A1  May 18, 2023

Related U.S. Application Data

(63) Continuation of application No. PCT/KR2022/016773, filed on Oct. 30, 2022.

(30) Foreign Application Priority Data

Nov. 16, 2021 (KR) .......... 10-2021-0157488
Jan. 3, 2022 (KR) .......... 10-2022-0000231

(51) Int. Cl.
*H04W 52/24* (2009.01)
*H04W 52/14* (2009.01)

(52) U.S. Cl.
CPC ....... *H04W 52/146* (2013.01); *H04W 52/241* (2013.01)

(58) Field of Classification Search
CPC . H03F 3/38; H03F 3/45; H04B 17/13; H04W 52/52
See application file for complete search history.

(56) References Cited

U.S. PATENT DOCUMENTS

2018/0184388 A1   6/2018  Kam
2018/0351454 A1 * 12/2018 Khesbak .............. H02M 3/156
2018/0375475 A1  12/2018  Nag et al.

FOREIGN PATENT DOCUMENTS

CN        112532053 A    3/2021
EP          2920877 B1    1/2018
(Continued)

OTHER PUBLICATIONS

The extended European search report for EP Application No. 22895896.3 mailed on Dec. 9, 2024, citing the above reference(s).
(Continued)

*Primary Examiner* — Tu X Nguyen
(74) *Attorney, Agent, or Firm* — CANTOR COLBURN LLP

(57) ABSTRACT

A method of controlling power supply for amplifying a radio frequency (RF) signal includes: determining whether a power supply mode for supplying power from a power modulator of a communication apparatus to an amplifier for amplifying the RF signal is an envelope tracking (ET) mode for supplying power based on ET of the RF signal; when the power supply mode is the ET mode, determining whether a downlink block error rate in the ET mode and a downlink modulation method in the ET mode satisfy a first condition; when the first condition is satisfied, determining whether a full resource block (RB) in an uplink band is allocated to uplink data transmission; and when the full RB in the uplink band is allocated to uplink data transmission, switching the power supply mode to an average power tracking (APT)
(Continued)

mode for supplying power based on average power of the RF signal.

20 Claims, 6 Drawing Sheets

(56) References Cited

FOREIGN PATENT DOCUMENTS

| | | | |
|---|---|---|---|
| EP | 3301840 A1 | 4/2018 | |
| EP | 3726893 A1 * | 10/2020 | .......... H04W 52/146 |
| KR | 10-2017-0104238 A | 9/2017 | |
| KR | 10-2020-0010830 A | 1/2020 | |
| KR | 10-2020-0122887 A | 10/2020 | |
| KR | 10-2021-0022351 A | 3/2021 | |
| WO | 2020/251063 A1 | 12/2020 | |

OTHER PUBLICATIONS

International Search Report mailed Feb. 8, 2023 for PCT/KR2022/016773, citing the above reference(s). In conformance with MPEP 609—Concise explanation of the relevance includes issue date of foreign OA and references cited therein.

* cited by examiner

METHOD OF CONTROLLING POWER SUPPLY FOR AMPLIFYING RADIO FREQUENCY SIGNAL AND COMMUNICATION APPARATUS FOR PERFORMING THE SAME

CROSS-REFERENCE TO RELATED APPLICATIONS

This application is a continuation application of International Application No. PCT/KR2022/016773 designating the United States, filed on Oct. 30, 2022, in the Korean Intellectual Property Receiving Office and claiming priority to Korean Patent Application No. 10-2021-0157488, filed on Nov. 16, 2021, and Korean Patent Application No. 10-2022-0000231, filed on Jan. 3, 2022, in the Korean Intellectual Property Office, the disclosures of which are incorporated by reference herein in their entireties.

BACKGROUND

1. Field

The disclosure relates to a method of controlling power supply for amplifying a radio frequency (RF) signal.

2. Description of Related Art

A communication apparatus for transmitting and receiving a radio frequency (RF) signal may use an amplifier for amplifying the RF signal. Predetermined power may be supplied to the amplifier. To increase power efficiency, a method of supplying power to the amplifier may include an average power tracking (APT) method of supplying power based on average power of the RF signal and an envelope tracking (ET) method of supplying power based on ET of the RF signal.

SUMMARY

When supplying power to an amplifier in an envelope tracking (ET) method to amplify a radio frequency (RF) signal, the possible occurrence of ET switching noise may decrease performance of receiving the RF signal by a communication apparatus. In addition, power consumption may increase when using an average power tracking (APT) mode.

According to one example embodiment, a method of controlling power supply for amplifying an RF signal and a communication apparatus for performing the same may control an increase in power consumption when using an APT mode by setting a condition for switching between an ET mode and the APT mode.

According to one example embodiment, a communication apparatus includes: an amplifier for amplifying an RF signal, a power modulator for supplying power to the amplifier, and a processor for controlling the power modulator. The processor is configured to determine whether a power supply mode for supplying the power from the power modulator to the amplifier is an ET mode for supplying the power based on ET of the RF signal, when the power supply mode is the ET mode, determine whether a downlink block error rate in the ET mode and a downlink modulation method in the ET mode satisfy a first condition, when the first condition is satisfied, determine whether a full resource block (RB) in an uplink band is allocated to uplink data transmission, and when the full RB in the uplink band is allocated to the uplink data transmission, switch the power supply mode to an APT mode for supplying the power based on average power of the RF signal.

According to one example embodiment, a method of controlling power supply for amplifying an RF signal includes: determining whether a power supply mode for supplying power from a power modulator of a communication apparatus to an amplifier for amplifying the RF signal is an ET mode for supplying the power based on ET of the RF signal; when the power supply mode is the ET mode, determining whether a downlink block error rate in the ET mode and a downlink modulation method in the ET mode satisfy a first condition; when the first condition is satisfied, determining whether a full RB in an uplink band is allocated to uplink data transmission; and when the full RB in the uplink band is allocated to the uplink data transmission, switching the power supply mode to an APT mode for supplying the power based on average power of the RF signal.

According to one example embodiment, a method of controlling power supply for amplifying an RF signal and a communication apparatus for performing the same may control an increase in power consumption when using an APT mode by setting a condition for switching between an ET mode and the APT mode.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Figure 1:
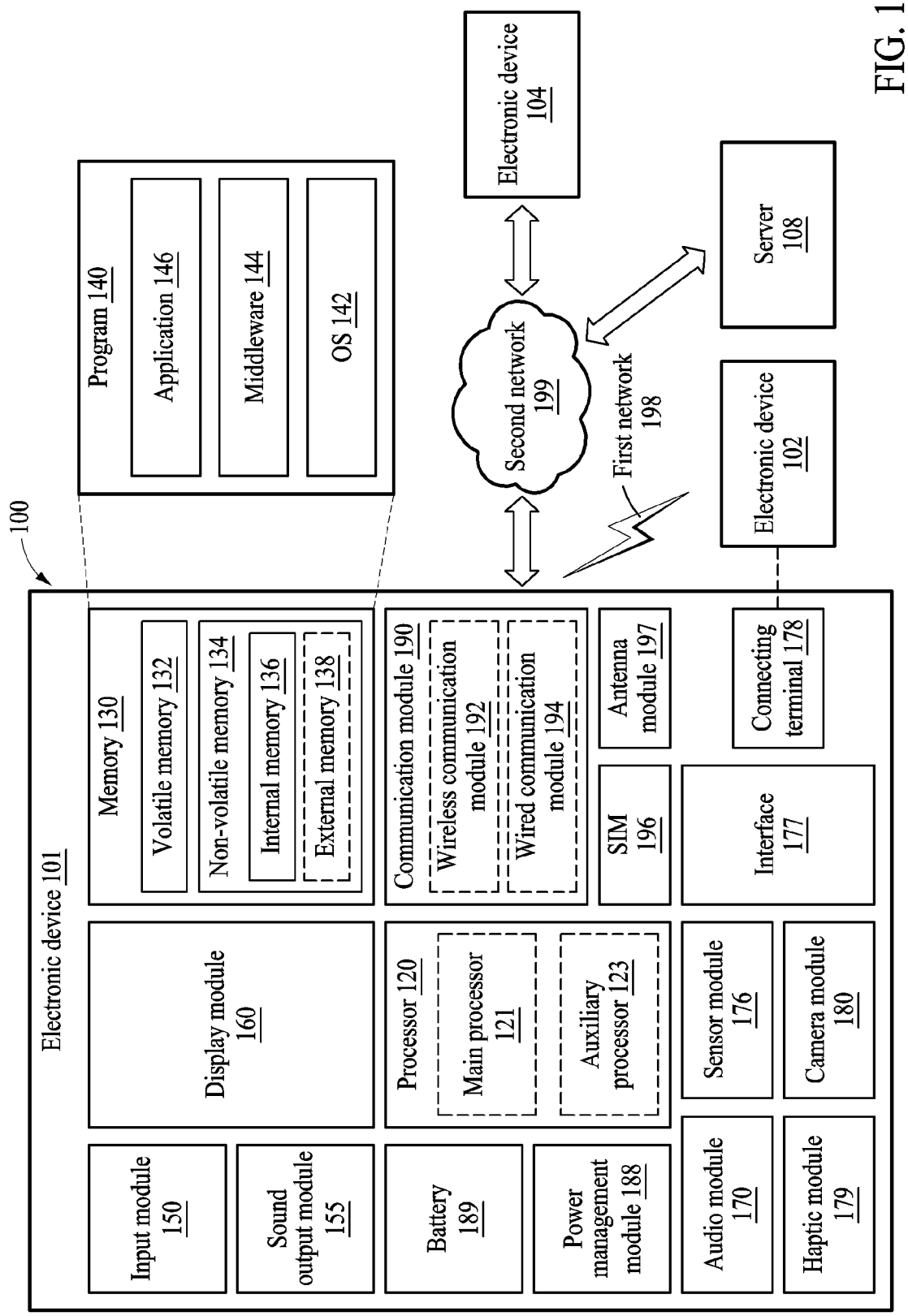
FIG. 1 is a block diagram illustrating an electronic device in a network environment according to various example embodiments.

Hereinafter, example embodiments will be described in detail with reference to the accompanying drawings. When describing the example embodiments with reference to the accompanying drawings, like reference numerals refer to like elements and a repeated description related thereto will be omitted.

FIG. 1 is a block diagram illustrating an electronic device 101 in a network environment 100 according to various example embodiments. Referring to FIG. 1, the electronic device 101 in the network environment 100 may communicate with an electronic device 102 via a first network 198 (e.g., a short-range wireless communication network), or communicate with at least one of an electronic device 104 and a server 108 via a second network 199 (e.g., a long-range wireless communication network). According to an example embodiment, the electronic device 101 may communicate with the electronic device 104 via the server 108. According to an example embodiment, the electronic device 101 may include a processor 120, a memory 130, an input module 150, a sound output module 155, a display module 160, an audio module 170, and a sensor module 176, an interface 177, a connecting terminal 178, a haptic module 179, a camera module 180, a power management module 188, a battery 189, a communication module 190, a subscriber identification module (SIM) 196, or an antenna module 197. In some example embodiments, at least one of the components (e.g., the connecting terminal 178) may be omitted from the electronic device 101, or one or more other components may be added to the electronic device 101. In some example embodiments, some of the components (e.g., the sensor module 176, the camera module 180, or the antenna module 197) may be integrated as a single component (e.g., the display module 160).

The processor 120 may execute, for example, software (e.g., a program 140) to control at least one other component (e.g., a hardware or software component) of the electronic device 101 connected to the processor 120 and may perform various data processing or computations. According to an example embodiment, as at least a part of data processing or computations, the processor 120 may store a command or data received from another component (e.g., the sensor module 176 or the communication module 190) in a volatile memory 132, process the command or the data stored in the volatile memory 132, and store resulting data in a non-volatile memory 134. According to an example embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from or in conjunction with the main processor 121. For example, when the electronic device 101 includes the main processor 121 and the auxiliary processor 123, the auxiliary processor 123 may be adapted to consume less power than the main processor 121 or to be specific to a specified function. The auxiliary processor 123 may be implemented separately from the main processor 121 or as a part of the main processor 121.

The auxiliary processor 123 may control at least some of functions or states related to at least one (e.g., the display module 160, the sensor module 176, or the communication module 190) of the components of the electronic device 101, instead of the main processor 121 while the main processor 121 is in an inactive (e.g., sleep) state or along with the main processor 121 while the main processor 121 is an active state (e.g., executing an application). According to an example embodiment, the auxiliary processor 123 (e.g., an ISP or a CP) may be implemented as a portion of another component (e.g., the camera module 180 or the communication module 190) that is functionally related to the auxiliary processor 123. According to an example embodiment, the auxiliary processor 123 (e.g., an NPU) may include a hardware structure specifically for artificial intelligence model processing. An artificial intelligence model may be generated by machine learning. The machine learning may be performed by, for example, the electronic device 101, in which artificial intelligence is performed, or performed via a separate server (e.g., the server 108). Learning algorithms may include, but are not limited to, for example, supervised learning, unsupervised learning, semi-supervised learning, or reinforcement learning. The artificial intelligence (AI) model may include a plurality of artificial neural network layers. An artificial neural network may include, for example, a deep neural network (DNN), a convolutional neural network (CNN), a recurrent neural network (RNN), a restricted Boltzmann machine (RBM), a deep belief network (DBN), and a bidirectional recurrent deep neural network (BRDNN), a deep Q-network, or a combination of two or more thereof, but is not limited thereto. The AI model may additionally or alternatively include a software structure other than the hardware structure.

The memory 130 may store various pieces of data used by at least one component (e.g., the processor 120 or the sensor module 176) of the electronic device 101. The various pieces of data may include, for example, software (e.g., the program 140) and input data or output data for a command related thereto. The memory 130 may include the volatile memory 132 or the non-volatile memory 134.

The program 140 may be stored as software in the memory 130 and may include, for example, an operating system (OS) 142, middleware 144, or an application 146.

The input module 150 may receive, from outside (e.g., a user) the electronic device 101, a command or data to be used by another component (e.g., the processor 120) of the electronic device 101. The input module 150 may include, for example, a microphone, a mouse, a keyboard, a key (e.g., a button), or a digital pen (e.g., a stylus pen).

The sound output module 155 may output a sound signal to the outside of the electronic device 101. The sound output module 155 may include, for example, a speaker or a receiver. The speaker may be used for general purposes, such as playing multimedia or playing a recording. The receiver may be used to receive an incoming call. According to an example embodiment, the receiver may be implemented separately from the speaker or as a part of the speaker.

The display module 160 may visually provide information to the outside (e.g., a user) of the electronic device 101. The display module 160 may include, for example, a control circuit for controlling a display, a hologram device, or a projector and control circuitry to control its corresponding one of the display, the hologram device, and the projector. According to an example embodiment, the display module 160 may include a touch sensor adapted to detect a touch, or a pressure sensor adapted to measure the intensity of force of the touch.

The audio module 170 may convert sound into an electric signal or vice versa. According to an example embodiment, the audio module 170 may obtain the sound via the input module 150 or output the sound via the sound output module 155 or an external electronic device (e.g., the electronic device 102, such as a speaker or headphones) directly or wirelessly connected to the electronic device 101.

The sensor module 176 may detect an operational state (e.g., power or temperature) of the electronic device 101 or an environmental state (e.g., a state of a user) external to the electronic device 101 and generate an electric signal or data value corresponding to the detected state. According to an example embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used by the electronic device 101 to couple with the external electronic device (e.g., the electronic device 102) directly (e.g., by wire) or wirelessly. According to an example embodiment, the interface 177 may include, for example, a high-definition multimedia interface (HDMI), a universal serial bus (USB) interface, a secure digital (SD) card interface, or an audio interface.

The connecting terminal 178 may include a connector via which the electronic device 101 may physically connect to an external electronic device (e.g., the electronic device 102). According to an example embodiment, the connecting terminal 178 may include, for example, an HDMI connector, a USB connector, an SD card connector, or an audio connector (e.g., a headphones connector).

The haptic module 179 may convert an electric signal into a mechanical stimulus (e.g., a vibration or a movement) or an electrical stimulus, which may be recognized by a user via their tactile sensation or kinesthetic sensation. According to an example embodiment, the haptic module 179 may include, for example, a motor, a piezoelectric element, or an electric stimulator.

The camera module 180 may capture a still image and moving images. According to an example embodiment, the camera module 180 may include one or more lenses, image sensors, ISPs, and flashes.

The power management module 188 may manage power supplied to the electronic device 101. According to an example embodiment, the power management module 188 may be implemented as, for example, at least a part of a power management integrated circuit (PMIC).

The battery 189 may supply power to at least one component of the electronic device 101. According to an example embodiment, the battery 189 may include, for example, a primary cell, which is not rechargeable, a secondary cell, which is rechargeable, or a fuel cell. The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more CPs that are operable independently from the processor 120 (e.g., an AP) and that support direct (e.g., wired) communication or wireless communication. According to an example embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module, or a power line communication (PLC) module). A corresponding one of these communication modules may communicate with the external electronic device, for example, the electronic device 104, via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., a LAN or a wide area network (WAN)). These various types of communication modules may be implemented as a single component (e.g., a single chip), or may be implemented as multiple components (e.g., multiple chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., a mmWave band) to achieve, e.g., a high data transmission rate. The wireless communication module 192 may support various technologies for securing performance on a high-frequency band, such as, e.g., beamforming, massive multiple-input and multiple-output (MIMO), full dimensional MIMO (FD-MIMO), an array antenna, analog beam-forming, or a large scale antenna. The wireless communication module 192 may support various requirements specified in the electronic device 101, an external electronic device (e.g., the electronic device 104), or a network system (e.g., the second network 199).

According to an example embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an example embodiment, the antenna module 197 may include an antenna including a radiating element including a conductive material or a conductive pattern formed in or on a substrate (e.g., a printed circuit board (PCB)). According to an example embodiment, the antenna module 197 may include a plurality of antennas (e.g., an antenna array). In such a case, at least one antenna appropriate for a communication scheme used in a communication network, such as the first network 198 or the second network 199, may be selected by, for example, the communication module 190 from the plurality of antennas. The signal or power may be transmitted or received between the communication module 190 and the external electronic device via the at least one selected antenna. According to an example embodiment, another component (e.g., a radio frequency integrated circuit (RFIC)) other than the radiating element may be additionally formed as a part of the antenna module 197.

According to various example embodiments, the antenna module 197 may form a mmWave antenna module. According to an example embodiment, the mmWave antenna module may include a PCB, an RFIC on a first surface (e.g., the bottom surface) of the PCB, or adjacent to the first surface of the PCB and capable of supporting a designated high-frequency band (e.g., a mmWave band), and a plurality of antennas (e.g., array antennas) disposed on a second surface (e.g., the top or a side surface) of the PCB, or adjacent to the second surface of the PCB and capable of transmitting or receiving signals of the designated high-frequency band.

At least some of the above-described components may be coupled mutually and exchange signals (e.g., commands or data) therebetween via an inter-peripheral communication scheme (e.g., a bus, general purpose input and output (GPIO), serial peripheral interface (SPI), or mobile industry processor interface (MIPI)).

According to an example embodiment, commands or data may be transmitted or received between the electronic device 101 and the external electronic device (e.g., the electronic device 104) via the server 108 coupled with the second network 199. Each of the external electronic devices (e.g., the electronic device 102 or 104) may be a device of the same type as or a different type from the electronic device 101. According to an example embodiment, all or some of operations to be executed by the electronic device 101 may be executed by one or more external electronic devices (e.g., the electronic devices 102 and 104 and the server 108). For example, if the electronic device 101 needs to perform a function or a service automatically, or in response to a request from a user or another device, the electronic device 101, instead of, or in addition to, executing the function or the service, may request the one or more external electronic devices to perform at least part of the function or service. The one or more external electronic devices receiving the request may perform the at least part of the function or service, or an additional function or an additional service related to the request and may transfer a result of the performance to the electronic device 101. The electronic device 101 may provide the result, with or without further processing the result, as at least part of a response to the request. To that end, cloud computing, distributed computing, mobile edge computing (MEC), or client-server computing technology may be used, for example. The electronic device 101 may provide ultra low-latency services using, e.g., distributed computing or MEC. In an example embodiment, the external electronic device (e.g., the electronic device 104) may include an Internet-of-things (IoT) device. The server 108 may be an intelligent server using machine learning and/or a neural network. According to an example embodiment, the external electronic device (e.g., the electronic device 104) or the server 108 may be included in the second network 199. The electronic device 101 may be applied to intelligent services (e.g., a smart home, a smart city, a smart car, or healthcare) based on 5G communication technology or IoT-related technology.

Figure 2:
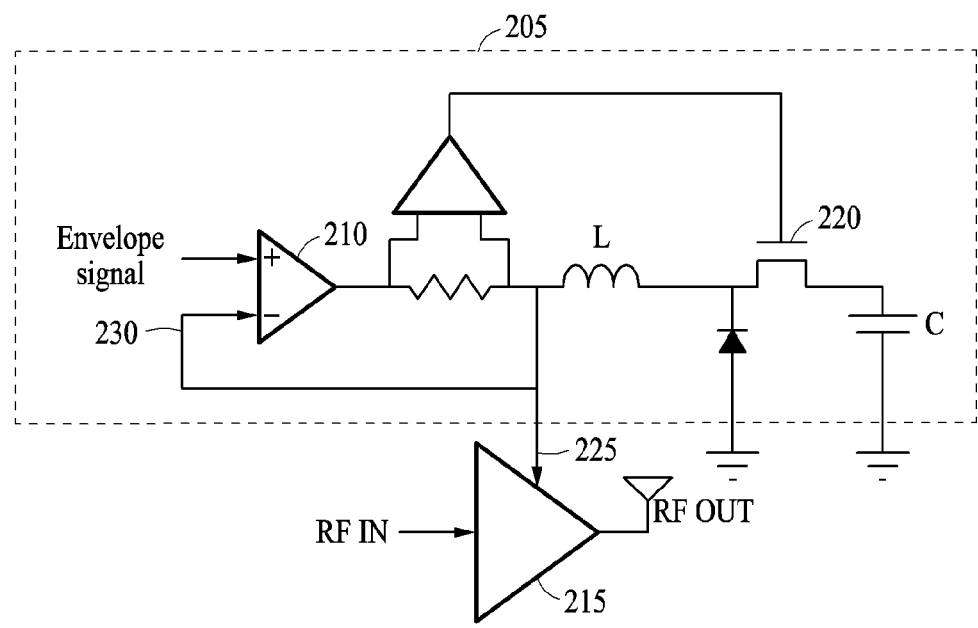
FIG. 2 is a diagram illustrating envelope tracking (ET) switching noise caused when supplying power based on ET of a radio frequency (RF) signal in a communication apparatus according to one example embodiment.

FIG. 2 is a diagram illustrating envelope tracking (ET) switching noise caused when supplying power based on ET of a radio frequency (RF) signal in a communication apparatus (not shown) (e.g., the electronic device 101 of FIG. 1) according to one example embodiment.

Referring to FIG. 2, illustrated are a power modulator 205 included in the communication apparatus (not shown) and an amplifier 215 for amplifying the RF signal by receiving power from the power modulator 205. The RF signal amplified by the amplifier 215 may be a signal transmitted from the communication apparatus to the outside and may include data transmitted through a physical uplink shared channel (PUSCH).

The communication apparatus (especially, the power modulator 205) may supply power to the amplifier 215 in various power supply modes. For example, the communication apparatus (especially, the power modulator 205) may supply predetermined voltage or supply power to the amplifier 215 in an ET mode, which is a power supply mode for supplying power based on ET of the RF signal, or in an average power tracking (APT) mode, which is a power supply mode for supplying power based on average power of the RF signal to increase power efficiency.

Although supplying power in the ET mode is more power-efficient than supplying power in the APT mode, possible ET switching noise may affect reception performance of the communication apparatus.

For example, in FIG. 2, the power modulator 205 may supply power to the amplifier 215 in the ET mode. The power modulator 205 may include an amplifier 210 for receiving and amplifying an envelope signal of an RF signal, a switch 220 that is on and off based on an output of the amplifier 210, a capacitor C that is charged and discharged based on the on and off of the switch 220, and an inductor L for supplying power charged and discharged in the capacitor C to the amplifier 215.

The envelope signal of an RF signal may be input to the power modulator 205, and the input envelope signal may be amplified by the amplifier 210 of the power modulator 205. The amplifier 210 may be a linear amplifier. The switch 220 may be on and off based on an output of the amplifier 210, and output power of the power modulator 205 may be supplied to the amplifier 215 through the inductor L.

Output voltage 225 of the power modulator 205 may be provided back as a differential input 230 of the amplifier 210. A difference between the voltage of the envelope signal input to the amplifier 210 and the output voltage 225 of the power modulator 205 may be reflected, as an error, in the output of the amplifier 210.

The switch 220 may be repeatedly on and off based on the output of the amplifier 210 and may output voltage in a rectangular waveform. The rectangular-waveform voltage may cause ET switching noise.

The ET switching noise may be applied to a reception port of an RFIC of the communication apparatus through front-end configuration, such as a duplexer, a low-noise amplifier (LNA), and a surface acoustic wave (SAW) filter of the communication apparatus, and may decrease the reception performance of the communication apparatus at maximum power.

The ET switching noise may affect the reception performance more in a certain communication band than other bands. For example, the ET switching noise may affect the reception performance more in a communication band where an interval between an uplink band and a downlink band is relatively narrow. For example, when the communication apparatus uses B5 and B8 bands of long-term evolution (LTE) communication, the interval between the uplink and downlink bands is narrower than other LTE communication bands.

Therefore, the ET switching noise may further affect the reception performance. In a communication band where the reception performance is degraded by the ET switching noise, the communication apparatus may supply power to the amplifier 215 by using the APT mode, but power efficiency may decrease.

According to one example embodiment, a method of controlling power supply for amplifying an RF signal and a communication apparatus for performing the same may control an increase in power consumption when using an APT mode by setting a condition for switching between an ET mode and the APT mode.

Hereinafter, referring to FIG. 3, descriptions are provided on the configuration of a method of controlling power supply for amplifying an RF signal and a communication apparatus for performing the same.

Figure 3:
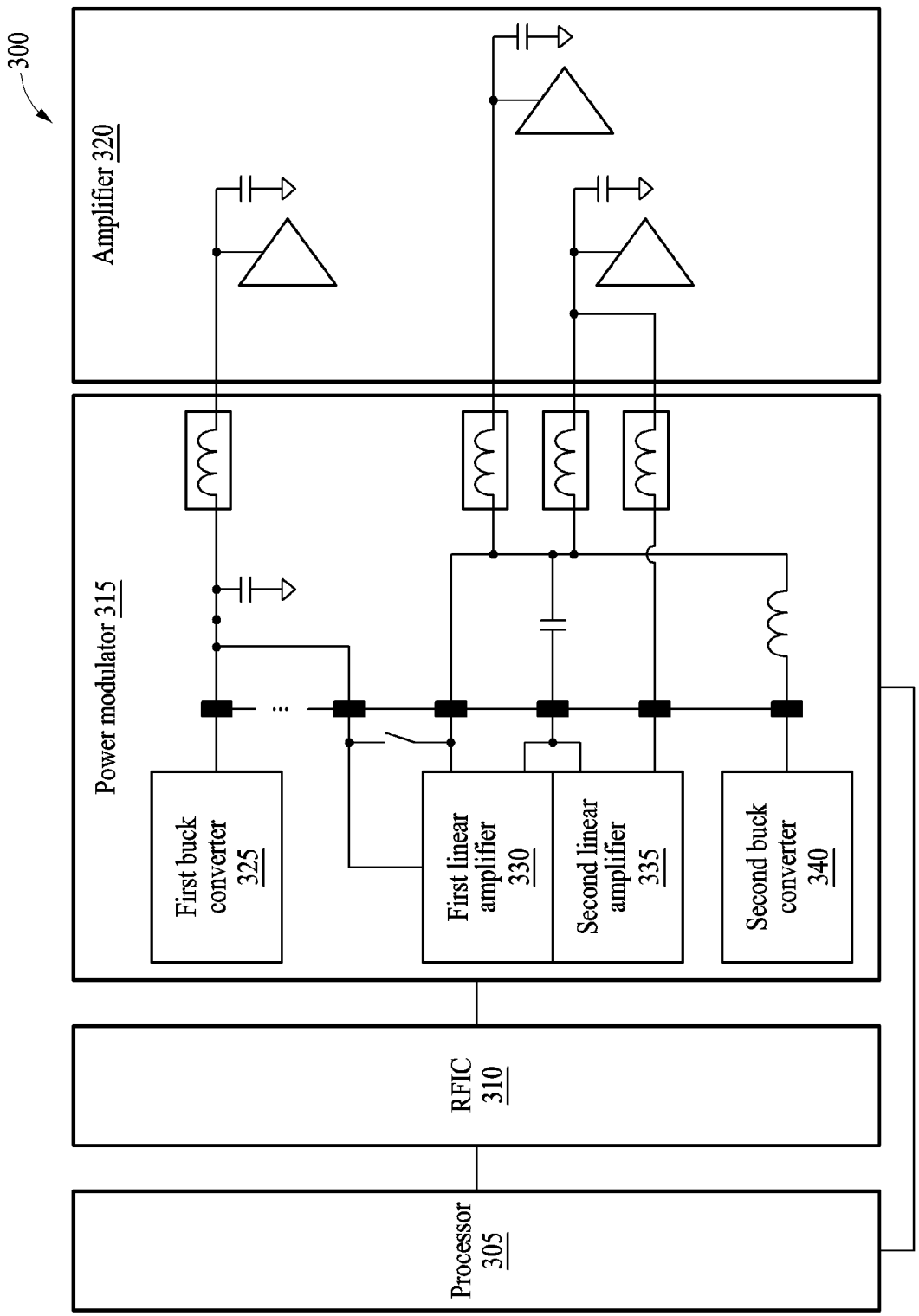
FIG. 3 is a block diagram illustrating a communication apparatus according to one example embodiment.

FIG. 3 is a block diagram illustrating a communication apparatus according to one example embodiment.

Referring to FIG. 3, a communication apparatus 300 may include an amplifier 320 for amplifying an RF signal transmitted to the outside through an antenna, a power modulator 315 for supplying power to the amplifier 320, and a processor 305 for controlling the power modulator 315. The processor 305 may include a communication processor for processing a digital signal.

The communication apparatus 300 may process a transmitted or received RF signal and may include an RFIC 310 for performing conversion between analog and digital signals. The communication apparatus 300 may include a front-end circuit (not shown) for preprocessing an RF signal converted into an analog signal by the RFIC 310, and the front-end circuit may include the amplifier 320.

The power modulator 315, to reduce power loss in the amplifier 320, may supply power to the amplifier 320 in an APT or ET mode. Referring to FIG. 3, a circuit of the power modulator 315 is illustrated as an example. For example, the power modulator 315 may include a first buck converter 325 for supplying power to the amplifier 320 in the APT mode. For example, the first buck converter 325 may be a buck boost converter.

The power modulator 315 may include at least one linear amplifier for supplying power in the ET mode. For example, the power modulator 315 may include a first linear amplifier 330 for converting power for 3-generation (3G) communication and LTE communication and a second linear amplifier 335 for converting power for 5G communication and 5G Sub-6 communication. To improve ET performance of a rapidly changing RF signal, the power modulator 315 may include a second buck converter 340, which slowly operates compared to the first linear amplifier 330. However, the configuration of the circuit of the power modulator 315 illustrated in FIG. 3 is merely an example, and the power modulator 315 may be variously configured.

The amplifier 320 may include at least one amplifier based on the frequency feature of an RF signal to be amplified.

The processor 305, based on a downlink block error rate (BLER) and a downlink modulation method of an RF signal, may determine a power supply mode with respect to the amplifier 320 between any one of the APT mode and the ET mode, and based on the determined mode, may control the power modulator 315.

The processor 305 may determine whether the power supply mode for supplying power to the amplifier 320 from the power modulator 315 is the ET mode. The processor 305, when the power supply mode is the ET mode, may determine whether a downlink BLER in the ET mode and a downlink modulation method in the ET mode satisfy a first condition. The processor 305, when the first condition is satisfied, may determine whether a full resource block (RB) in an uplink band is allocated to uplink data transmission. The processor 305, when the full RB in the uplink band is allocated to the uplink data transmission, may switch the power supply mode to the APT mode.

The first condition may include a condition whether the downlink BLER in the ET mode is greater than or equal to a first reference downlink BLER corresponding to the downlink modulation method in the ET mode. For example, a downlink modulation method, such as quadrature phase shift keying (QPSK), 16-quadrature amplitude modulation (16-QAM), 64-QAM, and/or 256-QAM, may be used as the downlink modulation method in the ET mode for an RF signal, and the first condition may include a condition on the first reference downlink BLER corresponding to the downlink modulation method usable in the ET mode. When the downlink BLER in the ET mode corresponding to the downlink modulation method used in the ET mode is greater than or equal to the first reference downlink BLER, the processor 305 may determine that the first condition is satisfied.

The first reference downlink BLER corresponding to the downlink modulation method in the ET mode in the first condition may be the same or differ depending on which downlink modulation method is used. For example, when the QPSK, 16-QAM, 64-QAM, or 256-QAM downlink modulation method is used in the ET mode, the first reference downlink BLER corresponding to the QPSK, 16-QAM, and 64-QAM downlink modulation methods in the first condition may be about 3%, and the first reference downlink BLER corresponding to the 256-QAM downlink modulation method may be about 5%. As another example, the first reference downlink BLER corresponding to the QPSK and 16-QAM downlink modulation methods may be about 3% and the first reference downlink BLER corresponding to the 64-QAM and 256-QAM downlink modulation methods may be about 5%. In yet another example, the first reference downlink BLER corresponding to the QPSK, 16-QAM, 64-QAM, and 256-QAM downlink modulation methods may be about 5%. As still another example, the first reference downlink BLER corresponding to the QPSK, 16-QAM, 64-QAM, and 256-QAM downlink modulation methods may be about 2%, 3%, 4%, and 5%, respectively.

TABLE 1

| First Condition | |
| --- | --- |
| Downlink Modulation Method | First Reference Downlink BLER |
| QPSK | 3% or more |
| 16-QAM | |
| 64-QAM | |
| 256-QAM | 5% or more |

Referring to Table 1, the first condition is provided as an example. A downlink BLER may vary depending on a downlink modulation method. For example, the downlink BLER may increase as the number of symbols used in downlink modulation increases. A symbol may be a unit representing the number of bits transmitted once in a modulation process. For example, 16-QAM may modulate an RF signal by using 16 symbols, and 64-QAM may modulate an RF signal by using 64 symbols.

The first reference downlink BLER corresponding to the downlink modulation method in the ET mode in the first condition may have a greater value as more symbols are used in the downlink modulation method in the ET mode. For example, in the example of Table 1, the downlink BLER may increase sequentially from QPSK to 16-QAM, 64-QAM, and 256-QAM.

When using the QPSK, 16-QAM, 64-QAM, and 256-QAM as a downlink modulation method and applying the same first reference downlink BLER of about 3% to the QPSK, 16-QAM, 64-QAM, and 256-QAM, the 256-QAM downlink modulation method in the ET mode may frequently exceed the first reference downlink BLER of about 3% corresponding to the downlink BLER in the ET mode. Therefore, a greater value (e.g., 5%) than the first reference downlink BLER of the QPSK, 16-QAM, and 64-QAM downlink modulation methods may be desirable to be the first reference downlink BLER corresponding to the 256-QAM downlink modulation method.

However, the downlink modulation methods provided herein and the first reference downlink BLER value corresponding to each downlink modulation method may only be an example for describing the first condition. In addition, the first condition may include a condition on various downlink modulation methods and a first reference downlink BLER on each downlink modulation method.

The processor 305, when the first condition is satisfied, may determine whether a full RB in an uplink band is allocated to uplink data transmission. The RB may refer to an allocable unit of frequency and may have a designated bandwidth. For example, the uplink band may be divided into a plurality of RBs and may be allocated to the uplink data transmission in RB units. For example, an uplink band with a 20 MHz bandwidth may be divided into 100 RBs, and the divided 100 RBs may be completely or partially allocated to the uplink data transmission.

When a full RB in an uplink band is allocated to the uplink data transmission, ET switching noise occurring in the ET mode may affect more the reception performance of the communication apparatus 300 than when a partial RB in the uplink band is allocated to the uplink data transmission. For example, when the communication apparatus 300 uses a B5 band of LTE communication including an uplink band of about 824 MHz to 849 MHz and a downlink band of about 869 MHz to 894 MHz, when a full RB in the uplink band is allocated to the uplink data transmission, 849 MHz frequency, which is near the downlink band, may be used. Accordingly, ET switching noise may have a great impact on reception performance in the downlink band. When a partial RB in the uplink band is allocated to the uplink data transmission, a frequency of which the uplink band is relatively far from the downlink band may be used. Accordingly, ET switching noise may have a relatively small impact on the reception performance in the downlink band.

The processor 305, since the ET switching noise may have a great impact on the reception performance when the full RB in the uplink band is allocated to the uplink data transmission, may switch the power supply mode to the APT mode. For example, when the uplink band is 20 MHz, the processor 305 may switch the power supply mode to the APT mode when 100 RBs are completely allocated to the uplink data transmission.

The processor 305, when a partial RB, not the full RB, in the uplink band is allocated to the uplink data transmission, may compare a downlink BLER in the APT mode to a downlink BLER in the ET mode. The processor 305 may compare the downlink BLER in the APT mode with the downlink BLER in the ET mode through a physical uplink control channel (PUCCH).

The processor 305, when the downlink BLER in the APT mode is less than the downlink BLER in the ET mode, may switch the power supply mode to the APT mode.

Based on the first condition, whether a full RB in an uplink band is allocated to the uplink data transmission, and/or a result of comparing a downlink BLER in the APT mode and a downlink BLER in the ET mode, the processor 305 may determine whether to switch from the ET mode to the APT mode. Accordingly, the processor 305 may reduce the number of times switching to the APT mode, additional power consumed by using the APT mode, and deterioration of reception performance and downlink throughput (T-PUT) performance.

To determine whether to switch the power supply mode from the APT mode to the ET mode, in the APT mode, the processor 305 may identify the downlink BLER in the ET mode and the downlink modulation method in the ET mode, and determine whether the downlink BLER in the ET mode and the downlink modulation method in the ET mode satisfy a second condition. The processor 305 may identify the downlink BLER in the ET mode and the downlink modulation method in the ET mode through the PUCCH.

The second condition may include a condition whether the downlink BLER in the ET mode is less than a second reference downlink BLER corresponding to the downlink modulation method in the ET mode.

The second condition may include a condition on a second reference downlink BLER corresponding to the downlink modulation method that may be used in the ET mode. The processor 305, when the downlink BLER in the ET mode is less than the second reference downlink BLER corresponding to the downlink modulation method used in the ET mode, may determine that the second condition is satisfied.

The second reference downlink BLER may be a downlink BLER less than the first reference downlink BLER by a threshold value (e.g., 2% or other designated vales). The threshold value may be set to prevent frequent switching between the ET mode and the APT mode.

TABLE 2

| Second Condition | |
| --- | --- |
| Downlink Modulation Method | Second Reference Downlink BLER |
| QPSK | less than 1% |
| 16-QAM | |
| 64-QAM | |
| 256-QAM | less than 3% |

Referring to Table 2, the second condition corresponding to the first condition in Table 1 is provided as an example. For example, when, in the first condition, the first downlink BLER corresponding to the QPSK, 16-QAM, and 64-QAM downlink modulation methods is about 3%, and the first reference downlink BLER corresponding to the 256-QAM downlink modulation method is about 5%, in the second condition, the second downlink BLER corresponding to the QPSK, 16-QAM, and 64-QAM downlink modulation methods may be about 1%, and the second reference downlink BLER corresponding to the 256-QAM downlink modulation method may be about 3%.

As another example, when, in the first condition, the first downlink BLER corresponding to the QPSK and 16-QAM downlink modulation methods is around 3%, and the first reference downlink BLER corresponding to the 64-QAM and 256-QAM downlink modulation methods is about 5%, in the second condition, the second downlink BLER corresponding to the QPSK and 16-QAM downlink modulation methods may be about 1%, and the second reference downlink BLER corresponding to the 64-QAM and 256-QAM downlink modulation methods may be about 3%. In yet another example, when, in the first condition, the first reference downlink BLER corresponding to the QPSK, 16-QAM, 64-QAM, and 256-QAM downlink modulation methods is about 5%, in the second condition, the second reference downlink BLER corresponding to the QPSK, 16-QAM, 64-QAM, and 256-QAM downlink modulation methods may be about 3%. As still another example, when, in the first condition, the first reference downlink BLER corresponding to the QPSK, 16-QAM, 64-QAM, and 256-QAM downlink modulation methods is about 2%, 3%, 4%, and 5%, respectively, in the second condition, the second reference downlink BLER corresponding to the QPSK, 16-QAM, 64-QAM, and 256-QAM downlink modulation methods may be about 1%, 2%, 3%, and 4%, respectively.

However, the downlink modulation methods provided herein and the second reference downlink BLER value corresponding to each downlink modulation method may only be an example for describing the second condition. In addition, the second condition may include a condition on various downlink modulation methods and a second reference downlink BLER on each downlink modulation method.

The processor 305, when the second condition is not satisfied, may periodically identify, through the PUCCH, the downlink BLER in the ET mode and the downlink modulation method in the ET mode and may determine whether the downlink BLER in the ET mode and the downlink modulation method in the ET mode satisfy the second condition. The processor 305, when the second condition is satisfied, may switch the power supply mode to the ET mode.

Figure 4A:
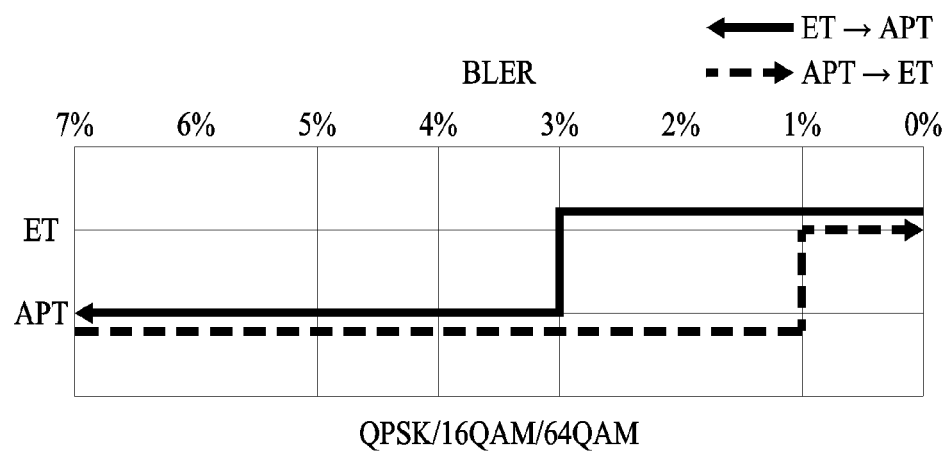
FIGS. 4A and 4B are diagrams illustrating a condition on a downlink block error rate and a downlink modulation method in a power supply control method according to one example embodiment.
Figure 4B:
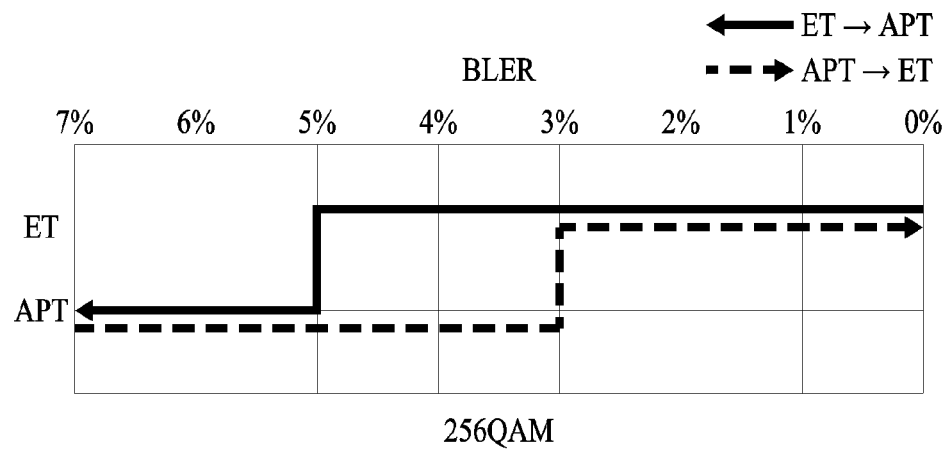

FIGS. 4A and 4B are diagrams illustrating a condition on a downlink BLER and a downlink modulation method in a power supply control method according to one example embodiment.

FIGS. 4A and 4B illustrate an example of switching a power supply mode in the first condition in Table 1 and the second condition in Table 2 provided as examples with reference to FIG. 3.

Referring to FIG. 4A, in a case that QPSK, 16-QAM, or 64-QAM downlink modulation method is used in an ET mode, a processor (e.g., the processor 305 of FIG. 3), when a downlink BLER is greater than or equal to a first reference downlink BLER of about 3%, may determine that the first condition is satisfied and switch the power supply mode from the ET mode to the APT mode.

Referring to FIG. 4B, in a case that a 256-QAM downlink modulation method is used in the ET mode, the processor 305, when the downlink BLER is greater than or equal to the first reference downlink BLER of about 5%, may determine that a second condition is satisfied and switch the power supply mode from the ET mode to the APT mode.

The downlink BLER may increase as the number of symbols used in downlink modulation, and when applying the same first reference downlink BLER of about 3% to the QPSK, 16-QAM, 64-QAM, and 256-QAM, the 256-QAM downlink modulation method in the ET mode may frequently exceed the first reference downlink BLER of about 3% corresponding to the downlink BLER in the ET mode. Therefore, a greater value (e.g., 5%) than the first reference downlink BLER of the QPSK, 16-QAM, and 64-QAM downlink modulation methods may be desirable to be the first reference downlink BLER corresponding to the 256-QAM downlink modulation method.

The processor 305 may identify, through a PUCCH, in the APT mode, the downlink BLER in the ET mode and the downlink modulation method in the ET mode and may determine whether the downlink BLER in the ET mode and the downlink modulation method in the ET mode satisfy a second condition.

In FIG. 4A, in a case that the QPSK, 16-QAM, or 64-QAM downlink modulation method is used in the ET mode, the processor 305, when the downlink BLER is less than the second reference downlink BLER of about 1%, may determine that the second condition is satisfied and switch the power supply mode from the APT mode to the ET mode.

In FIG. 4B, in a case that the 256-QAM downlink modulation method is used in the ET mode, the processor 305, when the downlink BLER is less than the second reference downlink BLER of about 3%, may determine that the second condition is satisfied and switch the power supply mode from the APT mode to the ET mode.

The second reference downlink BLER may be a downlink BLER less than the first reference downlink BLER by a threshold value (e.g., 2% or other designated vales). The threshold value may be set to prevent frequent switching between the ET mode and the APT mode. However, the threshold value of about 2% is merely an example. A threshold value between the first reference downlink BLER and the second reference downlink BLER may be set variously.

Figure 5:
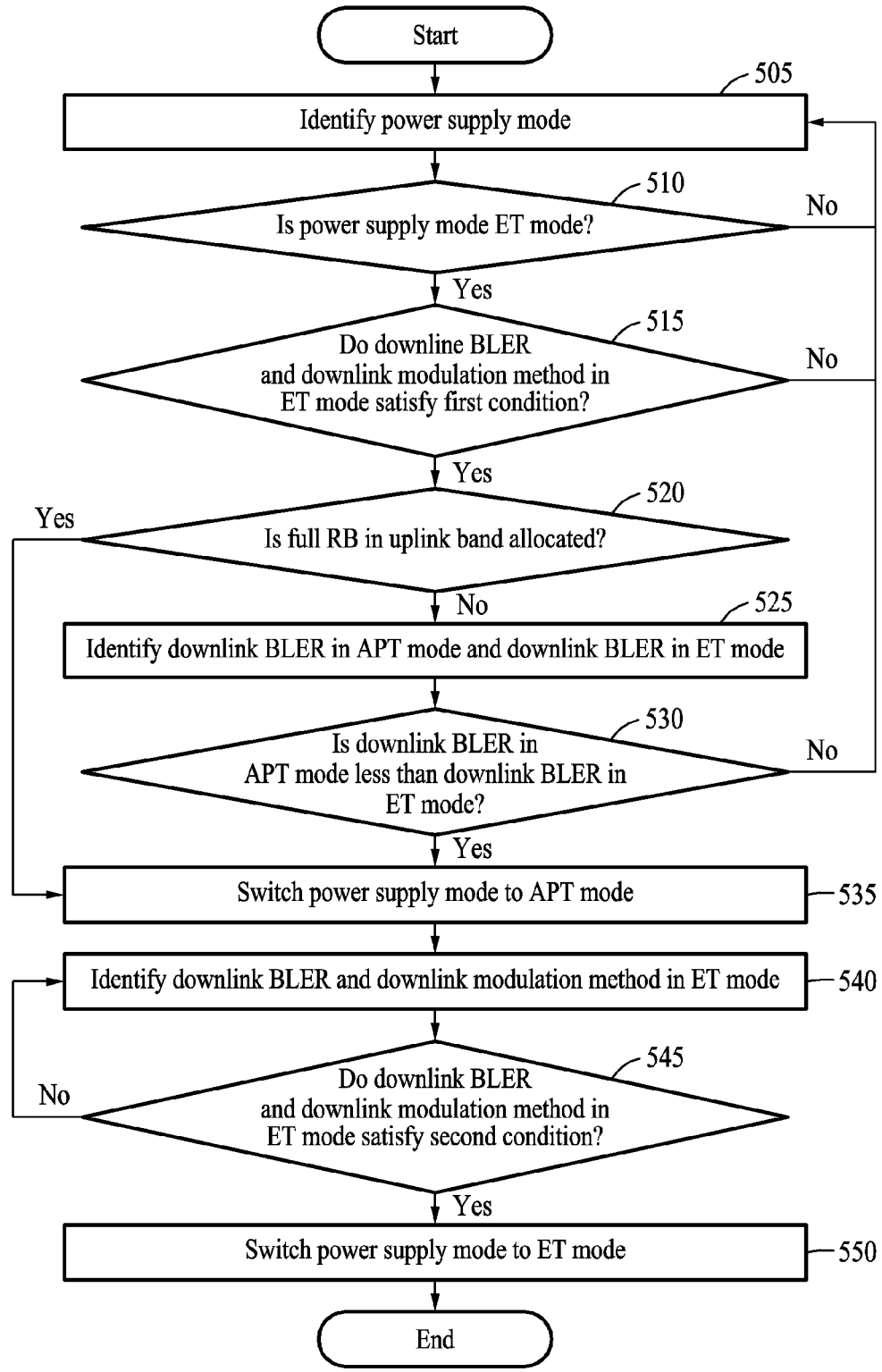
FIGS. 5 and 6 are flowcharts each illustrating a power supply control method according to one example embodiment.

FIG. 5 is a flowchart illustrating a power supply control method according to one example embodiment.

Referring to FIG. 5, in operation 505, a communication apparatus (e.g., the communication apparatus of FIG. 3) may identify a power supply mode for supplying power, and in operation 510, may determine whether the power supply mode is an ET mode.

When the power supply mode is not the ET mode in operation 510, the communication apparatus 300, in operation 505, may identify the power supply mode for supplying power again.

In operation 515, the communication apparatus 300, when the power supply mode is the ET mode, may determine whether a downlink BLER in the ET mode and a downlink modulation method in the ET mode satisfy a first condition. The communication apparatus 300, when the downlink BLER in the ET mode is greater than or equal to a first reference downlink BLER corresponding to the downlink modulation method used in the ET mode, may determine that the first condition is satisfied. The descriptions on the first condition provided with reference to FIG. 3 and FIG. 4A are not repeated.

When the downlink BLER in the ET mode and the downlink modulation method in the ET mode do not satisfy the first condition in operation 515, the communication apparatus 300, in operation 505, may identify the power supply mode for supplying power again.

When the downlink BLER in the ET mode and the downlink modulation method in the ET mode satisfy the first condition in operation 515, the communication apparatus 300, in operation 520, may determine whether a full RB in an uplink band is allocated to the uplink data transmission.

When the full RB in the uplink band is allocated in operation 520, the communication apparatus 300 may switch the power supply mode to the APT mode in operation 535.

When only a partial RB in the uplink band is allocated in operation 520 (i.e., the full RB in the uplink band is not allocated), the communication apparatus 300, in operation 525, may identify, through a PUCCH, a downlink BLER in an APT mode and the downlink BLER in the ET mode, and in operation 530, may determine whether the downlink BLER in the APT mode is less than the downlink BLER in the ET mode.

When the downlink BLER in the APT mode is not less than the downlink BLER in the ET mode in operation 530, the communication apparatus 300, in operation 505, may identify the power supply mode for supplying power again.

When the downlink BLER in the APT mode is less than the downlink BLER in the ET mode in operation 530, the communication apparatus 300, in operation 535, may switch the power supply mode to the APT mode.

The communication apparatus 300, based on the first condition, whether the full RB in an uplink band is allocated to the uplink data transmission, and/or a result of comparing the downlink BLER in the APT mode to the downlink BLER in the ET mode, may determine whether to switch from the ET mode to the APT mode. Accordingly, the communication apparatus 300 may reduce the number of times switching to the APT mode and additional power consumed by using the APT mode.

To determine whether to switch the power supply mode from the APT mode to the ET mode, the communication apparatus 300, in operation 540, may identify the downlink BLER in the ET mode and the downlink modulation method in the ET mode through the PUCCH, and in operation 545, may determine whether the downlink BLER in the ET mode and the downlink modulation method in the ET mode satisfy a second condition. The communication apparatus 300, when the downlink BLER in the ET mode is less than a second reference downlink BLER corresponding to the downlink modulation method used in the ET mode, may determine that the second condition is satisfied. The descriptions on the second condition provided with reference to FIG. 3 and FIG. 4B are not repeated.

When the second condition is not satisfied in operation 545, the communication apparatus 300, in operation 540, may identify, through the PUCCH, the downlink BLER in the ET mode and the downlink modulation method in the ET mode again.

When the second condition is satisfied in operation 545, the communication apparatus 300, in operation 550 may switch the power supply mode to the ET mode.

Figure 6:
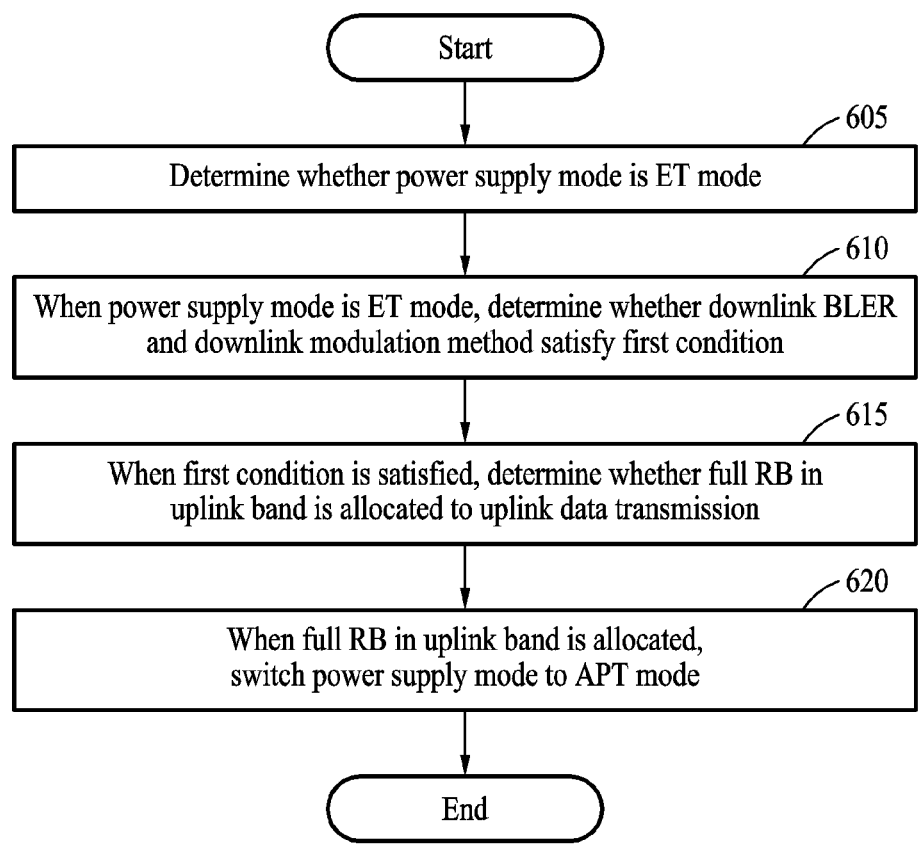

FIG. 6 is a flowchart illustrating a power supply control method according to one example embodiment.

Referring to FIG. 6, the power supply control method may include: determining whether a power supply mode for supplying power from a power modulator 315 of a communication apparatus 300 to an amplifier 320 for amplifying an RF signal is an ET mode for supplying the power based on the ET of the RF signal in operation 605; when the power supply mode is the ET mode, determining whether a downlink BLER in the ET mode and a downlink modulation method in the ET mode satisfy a first condition in operation 610; when the first condition is satisfied, determining whether a full RB in an uplink band is allocated to uplink data transmission in operation 615; and when the full RB in the uplink band is allocated to the uplink data transmission, switching the power supply mode to an APT mode for supplying power based on average power of the RF signal in operation 620.

Operation 605 may include operations 505 and 510 of FIG. 5. Operation 610 may correspond to operation 515 of FIG. 5. Operation 615 may correspond to operation 520 of FIG. 5. Operation 620 may correspond to operation 535 of FIG. 5.

The power supply control method, when a partial RB in the uplink band is allocated to uplink data transmission, may further include: comparing a downlink BLER in the APT mode with the downlink BLER in the ET mode; and when the downlink BLER in the APT mode is less than the downlink BLER in the ET mode, switching the power supply mode to the APT mode.

The power supply control method may further include: determining, in the APT mode, whether the downlink BLER in the ET mode and the downlink modulation method in the ET mode satisfy a second condition; and when the second condition is satisfied, switching the power supply mode to the ET mode.

The first condition may include a condition whether the downlink BLER in the ET mode is greater than or equal to a first reference downlink BLER corresponding to the downlink modulation method in the ET mode, and the determining whether the first condition is satisfied may include determining that the first condition is satisfied when the downlink BLER in the ET mode is greater than or equal to the first reference downlink BLER corresponding to the downlink modulation method in the ET mode.

The second condition may include a condition on whether the downlink BLER in the ET mode is less than a second reference downlink BLER corresponding to the downlink modulation method in the ET mode, and the determining whether the second condition is satisfied may include determining that the second condition is satisfied when the downlink BLER in the ET mode is less than the second reference downlink BLER corresponding to the downlink modulation method in the ET mode.

The second reference downlink BLER may be a downlink BLER less than the first reference downlink BLER by a threshold value.

The comparing the downlink block error rate in the APT mode with the downlink block error rate in the ET mode may be performed through a PUCCH.

The RF signal may include data transmitted through a PUSCH.

The first reference downlink BLER corresponding to the downlink modulation method in the ET mode in the first condition may have a greater value as more symbols are used in the downlink modulation method in the ET mode.

A communication apparatus 300 may include an amplifier 320 for amplifying an RF signal, a power modulator 315 for supplying power to the amplifier 320, and a processor 305 for controlling the power modulator 315, The processor 305 may determine whether a power supply mode for supplying the power from the power modulator 315 to the amplifier 320 is an ET mode for supplying the power based on ET of the RF signal, when the power supply mode is the ET mode, determine whether a downlink BLER in the ET mode and a downlink modulation method in the ET mode satisfy a first condition, when the first condition is satisfied, determine whether a full RB in an uplink band is allocated to uplink data transmission, and when the full RB in the uplink band is allocated to the uplink data transmission, switch the power supply mode to an APT mode for supplying the power based on average power of the RF signal.

The processor 305, when a partial RB in the uplink band is allocated to uplink data transmission, may compare a downlink BLER in the APT mode with the downlink BLER in the ET mode, and when the downlink BLER in the APT mode is less than the downlink BLER in the ET mode, switch the power supply mode to the APT mode.

The processor 305, may determine, in the APT mode, whether the downlink BLER in the ET mode and the downlink modulation method in the ET mode satisfy the second condition, and when the second condition is satisfied, switch the power supply mode to the ET mode.

The first condition may include a condition on whether the downlink BLER in the ET mode is greater than or equal to a first reference downlink BLER corresponding to the downlink modulation method in the ET mode, and the processor 305 may determine that the first condition is satisfied when the downlink BLER in the ET mode is greater than or equal to the first reference downlink BLER corresponding to the downlink modulation method in the ET mode.

The second condition may include a condition on whether the downlink BLER in the ET mode is less than a second reference downlink BLER corresponding to the downlink modulation method in the ET mode, and the processor 305 may determine that the second condition is satisfied when the downlink BLER in the ET mode is less than the second reference downlink BLER corresponding to the downlink modulation method in the ET mode.

The second reference downlink BLER may be a downlink BLER less than the first reference downlink BLER by a threshold value.

The processor 305 may compare the downlink BLER in the APT mode with the downlink BLER in the ET mode through a PUCCH.

The RF signal may include data transmitted through a PUSCH.

The first reference downlink BLER corresponding to the downlink modulation method in the ET mode in the first condition may have a greater value as more symbols are used in the downlink modulation method in the ET mode.

The processor 305, when the second condition is not satisfied, in the APT mode, periodically perform the determining whether the downlink BLER in the ET mode and the downlink modulation method in the ET mode satisfy the second condition.

The electronic device according to various example embodiments may be one of various types of electronic devices. The electronic device may include, for example, a portable communication device (e.g., a smartphone), a computer device, a portable multimedia device, a portable medical device, a camera, a wearable device, or a home appliance device. According to an example embodiment of the disclosure, the electronic device is not limited to those described above.

It should be understood that various example embodiments of the present disclosure and the terms used therein are not intended to limit the technological features set forth herein to particular embodiments and include various changes, equivalents, or replacements for a corresponding embodiment. In connection with the description of the drawings, like reference numerals may be used for similar or related components. It is to be understood that a singular form of a noun corresponding to an item may include one or more of the things unless the relevant context clearly indicates otherwise. As used herein, "A or B", "at least one of A and B", "at least one of A or B", "A, B or C", "at least one of A, B and C", and "A, B, or C," each of which may include any one of the items listed together in the corresponding one of the phrases, or all possible combinations thereof. Terms such as "first", "second", or "first" or "second" may simply be used to distinguish the component from other components in question, and do not limit the components in other aspects (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., by wire), wirelessly, or via a third element.

As used in connection with various example embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an example embodiment, the module may be implemented in a form of an application-specific integrated circuit (ASIC).

Various example embodiments as set forth herein may be implemented as software (e.g., the program 140) including one or more instructions that are stored in a storage medium (e.g., the internal memory 136 or the external memory 138) that is readable by a machine (e.g., the electronic device 101). For example, a processor (e.g., the processor 120) of the machine (e.g., the electronic device 101) may invoke at least one of the one or more instructions stored in the storage medium and execute it. This allows the machine to be operated to perform at least one function according to the at least one instruction invoked. The one or more instructions may include code generated by a compiler or code executable by an interpreter. The machine-readable storage medium may be provided in the form of a non-transitory storage medium. Here, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an example embodiment, a method according to various example embodiments of the disclosure may be included and provided in a computer program product. The computer program product may be traded as a product between a seller and a buyer. The computer program product may be distributed in the form of a machine-readable storage medium (e.g., a compact disc read-only memory (CD-ROM)), or be distributed (e.g., downloaded or uploaded) online via an application store (e.g., PlayStore™), or between two user devices (e.g., smartphones) directly. If distributed online, at least part of the computer program product may be temporarily generated or at least temporarily stored in the machine-readable storage medium, such as a memory of the manufacturer's server, a server of the application store, or a relay server.

According to various example embodiments, each component (e.g., a module or a program) of the above-described components may include a single entity or multiple entities, and some of the multiple entities may be separately disposed in different components.

According to various example embodiments, one or more of the above-described components may be omitted, or one or more other components may be added. Alternatively or additionally, a plurality of components (e.g., modules or programs) may be integrated into a single component. In such a case, according to various example embodiments, the integrated component may still perform one or more functions of each of the plurality of components in the same or similar manner as they are performed by a corresponding one of the plurality of components before the integration. According to various example embodiments, operations performed by the module, the program, or another component may be carried out sequentially, in parallel, repeatedly, or heuristically, or one or more of the operations may be executed in a different order or omitted, or one or more other operations may be added.

What is claimed is:

1. A communication apparatus comprising:
an amplifier for amplifying a radio frequency (RF) signal;
a power modulator for supplying power to the amplifier; and
a processor for controlling the power modulator,
wherein
the processor is configured to
determine whether a power supply mode for supplying the power from the power modulator to the amplifier is an envelope tracking (ET) mode for supplying the power based on ET of the RF signal,
when the power supply mode is the ET mode, determine whether a downlink block error rate in the ET mode and a downlink modulation method in the ET mode satisfy a first condition,
when the first condition is satisfied, determine whether a full resource block (RB) in an uplink band is allocated to uplink data transmission, and when the full RB in the uplink band is allocated to the uplink data transmission, switch the power supply mode to an average power tracking (APT) mode for supplying the power based on average power of the RF signal.

2. The communication apparatus of claim 1, wherein the processor is configured to,
when a partial RB, not the full RB, in the uplink band is allocated to the uplink data transmission, compare a downlink block error rate in the APT mode with the downlink block error rate in the ET mode, and
when the downlink block error rate in the APT mode is less than the downlink block error rate in the ET mode, switch the power supply mode to the APT mode.

3. The communication apparatus of claim 2, wherein the processor is configured to,
in the APT mode, determine whether the downlink block error rate in the ET mode and the downlink modulation method in the ET mode satisfy a second condition, and
when the second condition is satisfied, switch the power supply mode to the ET mode.

4. The communication apparatus of claim 3, wherein the processor is configured to,
when the second condition is not satisfied,
in the APT mode, periodically perform the determining whether the downlink block error rate in the ET mode and the downlink modulation method in the ET mode satisfy the second condition.

5. The communication apparatus of claim 3, wherein the first condition comprises:
a condition whether the downlink block error rate in the ET mode is greater than or equal to a first reference downlink block error rate corresponding to the downlink modulation method in the ET mode, and
the processor is configured to,
when the downlink block error rate in the ET mode is greater than or equal to the first reference downlink block error rate corresponding to the downlink modulation method in the ET mode, determine that the first condition is satisfied.

6. The communication apparatus of claim 5, wherein, in the first condition, the first reference downlink block error rate corresponding to the downlink modulation method in the ET mode has a greater value as a total number of symbols used in the downlink modulation method in the ET mode increases.

7. The communication apparatus of claim 5, wherein the second condition comprises:
a condition whether the downlink block error rate in the ET mode is less than a second reference downlink block error rate corresponding to the downlink modulation method in the ET mode, and
the processor is configured to,
when the downlink block error rate in the ET mode is less than the second reference downlink block error rate corresponding to the downlink modulation method in the ET mode, determine that the second condition is satisfied.

8. The communication apparatus of claim 7, wherein the second reference downlink block error rate is a downlink block error rate less than the first reference downlink block error rate by a threshold value.

9. The communication apparatus of claim 2, wherein the processor is configured to
compare the downlink block error rate in the APT mode with the downlink block error rate in the ET mode through a physical uplink control channel (PUCCH).

10. The communication apparatus of claim 1, wherein the RF signal comprises:
data transmitted through a physical uplink shared channel (PUSCH).

11. A method of controlling power supply for amplifying a radio frequency (RF) signal, the method comprising:
determining whether a power supply mode for supplying power from a power modulator of a communication apparatus to an amplifier for amplifying the RF signal is an envelope tracking (ET) mode for supplying the power based on ET of the RF signal;
when the power supply mode is the ET mode, determining whether a downlink block error rate in the ET mode and a downlink modulation method in the ET mode satisfy a first condition;
when the first condition is satisfied, determining whether a full resource block (RB) in an uplink band is allocated to uplink data transmission; and
when the full RB in the uplink band is allocated to the uplink data transmission, switching the power supply mode to an average power tracking (APT) mode for supplying the power based on average power of the RF signal.

12. The method of claim 11, further comprising:
when a partial RB, not the full RB, in the uplink band is allocated to the uplink data transmission, comparing a downlink block error rate in the APT mode with the downlink block error rate in the ET mode, and
when the downlink block error rate in the APT mode is less than the downlink block error rate in the ET mode, switching the power supply mode to the APT mode.

13. The method of claim 12, wherein
the comparing the downlink block error rate in the APT mode with the downlink block error rate in the ET mode is performed through a physical uplink control channel (PUCCH).

14. The method of claim 12, further comprising:
in the APT mode, determining whether the downlink block error rate in the ET mode and the downlink modulation method in the ET mode satisfy a second condition, and
when the second condition is satisfied, switching the power supply mode to the ET mode.

15. The method of claim 14, wherein
the first condition comprises:
a condition whether the downlink block error rate in the ET mode is greater than or equal to a first reference downlink block error rate corresponding to the downlink modulation method in the ET mode, and
determining whether the first condition is satisfied comprises:
when the downlink block error rate in the ET mode is greater than or equal to the first reference downlink block error rate corresponding to the downlink modulation method in the ET mode, determining that the first condition is satisfied.

16. The method of claim 15, wherein,
in the first condition, the first reference downlink block error rate corresponding to the downlink modulation method in the ET mode has a greater value as a total number of symbols used in the downlink modulation method in the ET mode increases.

17. The method of claim 15, wherein
the second condition comprises:
a condition whether the downlink block error rate in the ET mode is less than a second reference downlink block error rate corresponding to the downlink modulation method in the ET mode, and determining whether the second condition is satisfied comprises:

when the downlink block error rate in the ET mode is less than the second reference downlink block error rate corresponding to the downlink modulation method in the ET mode, determining that the second condition is satisfied, wherein the second reference downlink block error rate is a downlink block error rate less than the first reference downlink block error rate by a threshold value.

18. The method of claim 11, wherein the RF signal comprises:

data transmitted through a physical uplink shared channel (PUSCH).

19. A non-transitory computer-readable storage medium storing instructions that, when executed by a processor, cause the processor to perform the method of claim 11.

20. A method of controlling power supply for amplifying a RF signal, the method comprising:

determining whether a power supply mode for supplying power from a power modulator of a communication apparatus to an amplifier for amplifying the RF signal is an ET mode for supplying the power based on ET of the RF signal;

when the power supply mode is the ET mode, determining whether a downlink block error rate in the ET mode and a downlink modulation method in the ET mode satisfy a first condition;

when the first condition is satisfied, determining whether a partial RB in an uplink band is allocated to uplink data transmission;

when the partial RB in the uplink band is allocated to the uplink data transmission, comparing a downlink block error rate in an APT mode with the downlink block error rate in the ET mode, and when the downlink block error rate in the APT mode is less than the downlink block error rate in the ET mode, switching the power supply mode to the APT mode.

* * * * *